United States Patent [19]

Solomon

[11] 4,315,097
[45] Feb. 9, 1982

[54] BACK CONTACTED MIS PHOTOVOLTAIC CELL

[75] Inventor: Allen L. Solomon, Fullerton, Calif.

[73] Assignee: McDonnell Douglas Corporation, Long Beach, Calif.

[21] Appl. No.: 200,943

[22] Filed: Oct. 27, 1980

[51] Int. Cl.³ .............................................. H01L 31/06
[52] U.S. Cl. .................................. 136/255; 136/258; 357/15; 357/30
[58] Field of Search ............... 136/255, 258, 260, 261, 136/262; 357/15, 30

[56] References Cited

U.S. PATENT DOCUMENTS

| 3,502,507 | 3/1970 | Mann | 136/244 |
| 3,672,983 | 6/1972 | De Witt et al. | 427/89 |
| 3,903,427 | 9/1975 | Pack | 250/478 |
| 3,917,495 | 11/1975 | Horn | 148/187 |
| 4,133,698 | 1/1979 | Chiang et al. | 136/255 |
| 4,234,352 | 11/1980 | Swanson | 136/253 |

OTHER PUBLICATIONS

R. Singh et al., "Review of Conductor–Insulator–Semiconductor (CIS) Solar Cells", *Solar Cells*, Vol. 3, pp. 95-148, (1981).
Shang-Yi Chiang, Bernard G. Carbajal, Gene F. Wakefield, "Improved Performance Thin Solar Cells," *IEE Transactions on Electron Devices*, vol. Ed-25, No. 12, Dec. 1978, pp. 1405-1408.
R. B. Godfrey, M. A. Green, "A 15% Efficient Silicon MIS Solar Cell," Appl. Phys. Lett. 33(7), Oct. 1, 1978, pp. 637-639.
W. T. Matzen, S. Y. Chiang, B. G. Carbajal, "A Device Model for the Tandem Junction Solar Cell," *IEE Transactions on Electron Devices*, vol. Ed-26, No. 9, Sep. 1979, pp. 1365-1368.
J. Shewchun, R. Singh, M. A. Green, "Theory of Meta-l-Insulator-Semiconductor Solar Cells," *Journal of Applied Physics*, vol. 48, No. 2, Feb. 1977, pp. 765-770.
F. A. Lindholm, J. G. Fossum, "Review of Physics Underlying Recent Improvements in Silicon Solar-Cell Performance," Fourteenth IEEE Photovoltaic Specialists Conference, San Diego, California, Jan. 7-10, 1980, pp. 680-683.
Texas Instruments Incorporated, *Automated Array Assembly, Phase 2*, Texas Instruments Report No. 03-7-9-58, Nov., 1979.

Primary Examiner—Aaron Weisstuch
Attorney, Agent, or Firm—Gregory A. Cone; George W. Finch; Donald L. Royer

[57] ABSTRACT

This photovoltaic cell in a principal embodiment comprises a P-type substrate having an unshadowed first surface adapted to receiving incident radiation and a second surface which contains at least one ohmic contact and at least one metal-insulator-semiconductor contact, this structure thereby forming a back contacted minority carrier MIS cell.

23 Claims, 1 Drawing Figure

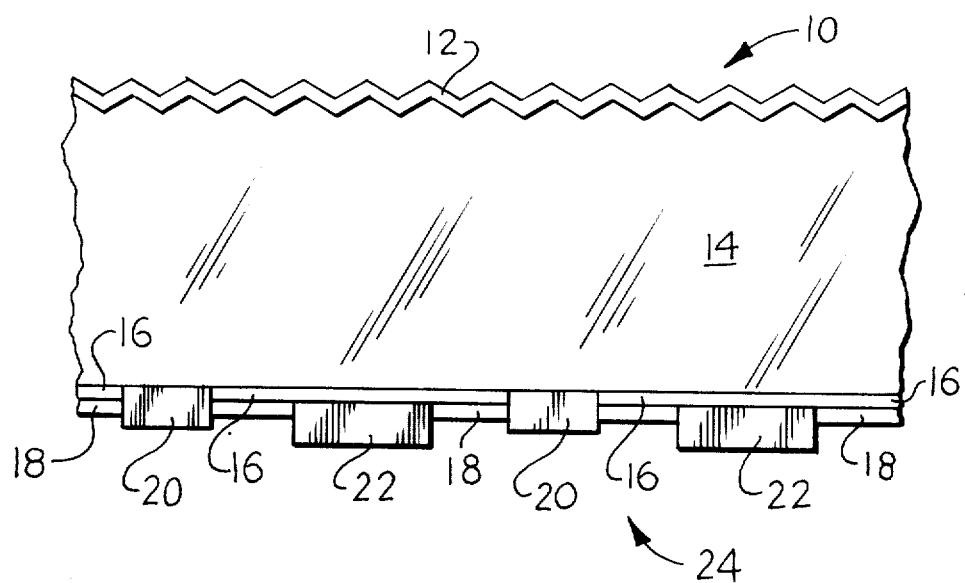

BACK CONTACTED MIS PHOTOVOLTAIC CELL

BACKGROUND OF THE INVENTION

1. Field of the Invention

This invention relates to photovoltaic devices and more particularly to back contacted metal-insulator-semiconductor (MIS) cells having a non-shadowed illuminated surface.

2. Description of the Prior Art

A photovoltaic cell is a device that directly converts photon radiant energy into electrical energy. In a semiconductor photovoltaic device, photons of sufficient energy react with the semiconductor atoms or molecules to produce negative and positive electrical charge carriers, electrons and holes, which can move freely throughout the semiconductor. The object of the device is to collect electrons at one electrical terminal and holes at a second electrical terminal before they recombine elsewhere within the semiconductor. To cause these free charge carriers to flow to their respective terminals, a barrier region is formed between the two terminals such that electrons move more easily than holes across the barrier in one direction and conversely for holes in the other direction. Until recently the most effective barrier in a semiconductor photovoltaic cell has been found to be a P-N junction, which is formed at the interface between P-type and N-type impurity contained regions of the semiconductor.

Efforts in the last ten years to produce efficient and economically viable terrestrial solar cells have depended in substantial part on being able to form P-N junctions in semiconductor materials at a high rate of manufacture. Recent developments in minority carrier metal-insulator-semiconductor (MIS) cells have demonstrated a barrier region that is of equal or greater effectiveness as the P-N junction and that is manufactured by a process which involves only the application of film coatings to the semiconductor surfaces.

The basic MIS cell structure comprises an approximately 100 micrometer thick P-type silicon substrate with a set of thin film contacts and coatings on both the top and bottom surfaces of the cell. The top or illuminated surface of the cell comprises a relatively thin layer of silicon dioxide, then an aluminum film contact grid or grating, and then an outer film coating of silicon nitride or silicon monoxide which provides a continuous inversion or depletion region across the illuminated surface, serves as an anti-reflection layer, and protects the aluminum grid and the underlying silicon from oxidation or other forms of atmospheric corrosion. The back or dark side of the substrate comprises a thin aluminum ohmic contact covering substantially all of the back surface of the cell. These processing steps are relatively uncomplicated and easy to accomplish. No P-N junction formation is required in the fabrication of this cell. Since relatively low temperature processing is used, high values for minority carrier diffusion length or lifetime can be achieved. This structure may also be used with semicrystalline, polycrystalline, or amorphous silicon; however, this will entail a reduced efficiency below that of monocrystalline silicon due to the shorter minority carrier diffusion lengths and lifetimes encountered in such materials. A shortcoming of this cell is the shadowing of the illumination by the opaque or nearly opaque contact grid metallization on the illuminated surface of the cell. Further, any attempt to increase the current carrying capacity of this MIS contact by increasing the width or number of the metal grid lines will result in increased shadowing.

A design direction that has produced fruitful results for avoiding illuminated-side contact shadowing is to place both P and N doped collector regions on the back or dark side of a photovoltaic cell. A leading design in this technology is the tandem junction cell which has been developed by Texan Instruments and is represented by U.S. Pat. No. 4,133,698, dated Jan. 9, 1979, to Chiang, et al, entitled "Tandem Junction Solar Cell." This cell comprises a P-type substrate with a layer of N-type material emplaced upon the upper or illuminated surface and a series of interleaved parallel P-N junctions on the back or dark side of the cell. The upper N-type layer or the P-type substrate is not electrically contacted and participates only indirectly in the collection of photogenerated carriers by providing an electric field to suppress front surface recombination and to enhance collection at the back side junction. A recent publication points out that if the semiconductor material has the properties of very low surface and bulk carrier recombination, the upper junction or front surface cell offers little or no advantage. However, these properties are not readily obtained by low-cost processes. In either event, since all metallization is on the back side of the cell, shadowing is avoided. The principal shortcoming of this cell is the difficulty in precisely forming the parallel P-N junctions on the dark side of the cell.

SUMMARY OF THE INVENTION

The photovoltaic cell of this invention is constructed as a back contacted minority carrier metal insulator semiconductor device. The cell itself comprises a semiconductor substrate of a P conductivity type having substantially parallel opposite surfaces of which a first surface is substantially free of any shadowing effects and is adapted to receiving radiation while the second surface has at least one ohmic contact and at least one metal-insulator-semiconductor (MIS) contact.

BRIEF DESCRIPTION OF THE DRAWING

The FIGURE is a cross sectional representation of the structure of the photovoltaic cell of this invention.

DETAILED DESCRIPTION OF THE INVENTION

The photovoltaic cell of this invention combines the desirable qualities of both the conventional minority carrier MIS cell and the conventional tandem junction cell while avoiding the disadvantages of each. Conventional minority carrier MIS cells are relatively inexpensive to manufacture because of the lack of any P-N junction formation in the fabrication of the devices as well as the high efficiency of this particular configuration from a theoretical standpoint as realized by the high open circuit voltage levels possible with this construction. The advantage of the tandem cell configuration is found in that there are no metallization layers present on the illuminated surface of the cell; therefore, shadowing effects are eliminated. Additionally, the interleaved array of the MIS and ohmic contacts on the back or dark side of the tandem cell result in highly efficient carrier collection with both a high open circuit voltage and a high short-circuit current.

The back contacted minority carrier MIS photovoltaic cell of this invention may be best understood by reference to the FIGURE. The front or illuminated surface of the device 10 will in most instances be covered by a layer of an anti-reflective coating 12 which preferably presents a high positive fixed charge at the P-type semiconductor 14 interface. The bulk of the substrate comprises a P-type conductivity layer 14 of a semiconductor material, most commonly silicon, although other IV A or VI A elemental semiconductors or gallium arsenide or other III A-V A compounds or II B-VI A compounds or IB-VI A compounds may also be employed. The top or illuminated surface 10 of the device is normally textured by conventional means such as etching to achieve a roughness which improves the light collecting qualities of the surface.

The back or dark side 24 of the device contains the electrodes and thin films utilized to draw and to collect the useful electrical energy from the device. The electrodes comprise essentially alternating ohmic metal contacts and minority carrier MIS contacts. These contacts will normally be interleaved as in the conventional tandem junction cell. The metallization films employed for this use have the added advantage of serving as reflectors on the back side of the photovoltaic cell to reflect any unabsorbed relatively high energy radiation back into the P-type substrate for additional generation of charge carriers therein. The ohmic contacts 20 comprise metallized strips, usually aluminum, which are disposed directly upon the back side of the P-type substrate 14 and are alloyed to the silicon. Ohmic contacts may also comprise silver, nickel overcoated with copper, or aluminum rich alloy. These ohmic electrodes 20 serve the same purpose as the P+ type regions in the conventional type tandem junction cell, namely, to collect holes, the majority carriers. The minority carrier MIS contacts 22 are normally emplaced between the metal-ohmic contacts 20. The minority carrier MIS contacts are formed by first forming an ultrathin, less than 50 angstroms, layer of silicon dioxide 16 directly on to the back side of the P-type substrate 14 covering the regions between the ohmic metal contacts 20. Metal electrode strips, again usually aluminum, 22 are then laid down on the outer surface of the silicon dioxide layer 16 in an area intermediate to and usually parallel with the metal-ohmic contacts 20. These MIS contacts 22 will normally cover a wider surface area than do the metal-ohmic contacts 20 in order to maximize the minority carrier collection through these electrodes. A silicon nitride layer 18 is then deposited on the remaining uncovered outer surfaces of the silicon dioxide layer 16. For some usages, it is desirable to extend this silicon nitride layer 18 over the outer surfaces of both the ohmic metal contacts 20 and the MIS contacts 22 in order to achieve maximum corrosion resistance. It will be apparent to those skilled in the art of semiconductor device fabrication that alternative procedures, such as the use of silicon nitride as a metal pattern definition mask or the use of differently deposited types of silicon nitride, may be employed.

The outer layer 12 utilized on the illuminated side of the device normally comprises silicon nitride because it possesses the best combination of properties over alternative materials for its three purposes: protection of underlying material, a high positive fixed charge, and a high refractive index for use as an anti-reflection coating. It should be noted, however, that silicon monoxide, SiO, could also be utilized for this purpose, although the desirable properties listed above are present only to a lesser degree. The positive fixed charge in layer 12 serves to induce an inversion or depletion layer at the surface of the P-type silicon substrate 14, which creates a front surface cell like the N-P junction in the conventional tandem junction cell. The presence of a thin native oxide layer between the anti-reflection layer 12 and the substrate 14 is probably inconsequential.

The presence of the ultrathin silicon dioxide layer 16, which may be native oxide, in the minority carrier MIS contact on the back or dark side of the cell is critical to the functioning of this device. The thickness of this layer is preferably in the range of from approximately 10 to approximately 25 angstroms. It is made ultrathin to enable minority charge carriers to tunnel through this insulative barrier and to be collected by the low work function metal electrode 22. The thicknesses of the other films of the photovoltaic cell are not critical for the operation of the device. In general, however, a silicon substrate layer 14 tends to be most efficient for a thickness range of approximately 50 to approximately 100 microns, although if very long diffusion length silicon is employed, thicknesses of hundreds of microns may be used.

It is apparent that a "mirror image" of this device can be constructed comprising a substrate of N-type silicon with a majority carrier MIS contact, employing a high work function metal in the MIS contact. Since the contact is then a Schottky barrier, there is likely to be a less effective induced barrier in the silicon and conversion efficiency will not be as high as in the P-type device. The N-type cell requires an upper surface coating with a negative fixed charge for the realization of its front surface cell in place of the positive fixed charge layer of the P-type cell.

In summary, the back contact minority carrier MIS cell offers a number of advantages over conventional photovoltaic cells. The device may be readily fabricated by a low-cost process which employs a minimum of complicated or critically controlled processing steps. The physics and physical construction of the device lend a means of obtaining the highest conversion efficiency, particularly for a silicon photovoltaic cell, in that the front surface is unshadowed, the minority carrier MIS contact provides a high open circuit voltage, and the long lifetime properties of the semiconductor are not degraded by high temperature cell fabrication processes. Also, the high current carrying capacity of the back contact MIS design enables this cell to be utilized as a concentrator cell. The textured front surface of the cell lends itself to efficient light collection. The utilization of a silicon nitride film on the front surface of the device provides a front surface cell as well as anti-reflection and anti-corrosion properties.

I claim:

1. A photovoltaic cell comprising a semiconductor substrate having substantially parallel opposite surfaces, a first surface thereof being substantially free of any shadowing effects and adapted to receive incident radiation, and a second opposite surface thereof having at least one ohmic contact and at least one metal-insulator-semiconductor (MIS) contact.

2. The cell of claim 1 wherein the semiconductor substrate comprises silicon.

3. The cell of claim 2 wherein the silicon is selected from the group consisting of monocrystalline silicon, polycrystalline silicon, and amorphous silicon.

4. The cell of claim 1 wherein the semiconductor substrate is selected from the group consisting of IV A elements other than silicon, VI A elements, III A-V A compounds, II B-VI A compounds, and I B-VI A compounds.

5. The cell of claim 1 further comprising a light transmitting anti-reflection coating layer substantially covering the first surface of the cell.

6. The cell of claim 1 wherein the insulator layer of the MIS contact comprises a layer of uniform thickness less than approximately 50 angstroms.

7. The cell of claim 1 wherein the insulator layer of the MIS contact comprises silicon dioxide.

8. The cell of claim 1 wherein the second surface is substantially covered by a protective insulator coating layer.

9. The cell of claim 1 wherein the first surface is textured.

10. A photovoltaic cell comprising a semiconductor substrate of a P conductivity type having substantially parallel opposite surfaces, a first surface thereof being substantially free of any shadowing effects and adapted to receive incident radiation, and a second opposite surface thereof having at least one ohmic contact and at least one minority carrier metal-insulator-semiconductor contact.

11. The cell of claim 10 wherein the metal-insulator-semiconductor contact comprises a thin insulator layer overlaid with a low work function metal.

12. The cell of claim 11 wherein the insulator layer is selected from the group consisting of silicon dioxide and native oxide, $SiO_x$, and has a thickness of less than approximately 50 angstroms.

13. The cell of claim 11 wherein the metal in the MIS contact comprises aluminum.

14. The cell of claim 10 wherein the semiconductor substrate comprises silicon.

15. The cell of claim 14 wherein the silicon is selected from the group consisting of monocrystalline silicon, polycrystalline silicon, and amorphous silicon.

16. The cell of claim 10 wherein the semiconductor substrate is selected from the group consisting of IV A elements other than silicon, VI A elements, III A-V A compounds, II B-VI A compounds, and I B-VI A compounds.

17. The cell claim 10 further comprising a light transmitting anti-reflection coating layer substantially covering the first surface of the cell.

18. The cell of claim 17 wherein the coating layer is selected from the group consisting of silicon nitride and silicon monoxide.

19. The cell of claim 10 wherein the first surface is textured.

20. The cell of claim 10 wherein the metal layer of the ohmic contact comprises aluminum.

21. The cell of claim 10 wherein the metal layer of the ohmic contact is selected from the group consisting of silver, and nickel overcoated with copper, and an aluminum rich alloy.

22. The cell of claim 10 wherein the second surface is substantially covered with a protective insulator coating layer.

23. The cell of claim 22 wherein the protective insulator coating layer is selected from the group consisting of silicon nitride and silicon monoxide.

* * * * *